United States Patent [19]
Yamasaki

[11] Patent Number: 5,351,048
[45] Date of Patent: Sep. 27, 1994

[54] ONE BIT HIGH SPEED SIGNAL PROCESSING SYSTEM UTILIZING CONTROLLED SPECTRUM OF QUANTIZATION NOISE

[76] Inventor: Yoshio Yamasaki, 5-19-29, Koishikawa, Bun Kyo-ku, Tokyo, Japan

[21] Appl. No.: 866,316

[22] Filed: Apr. 9, 1992

[51] Int. Cl.$^5$ .................................. H03M 3/02
[52] U.S. Cl. ........................... 341/110; 341/143
[58] Field of Search ............... 341/110, 131, 143

[56] References Cited

U.S. PATENT DOCUMENTS

| | | | |
|---|---|---|---|
| 4,692,738 | 9/1987 | Suzuki | 341/110 |
| 4,811,019 | 3/1989 | Julstrom et al. | 341/143 |
| 4,843,391 | 6/1989 | Lernout | 341/143 |
| 4,901,077 | 2/1990 | Christopher | 341/143 |
| 4,933,675 | 6/1990 | Beard | 341/110 |
| 4,983,967 | 1/1991 | McKenzie | 341/110 |
| 5,060,178 | 10/1991 | Kato et al. | 364/600 |

Primary Examiner—Marc S. Hoff
Attorney, Agent, or Firm—Trexler, Bushnell, Bushnell, Giangiorgi & Blackstone, Ltd.

[57] ABSTRACT

A 1-bit high speed method for analog-to-digital and digital-to-analog conversion of an analog input signal of a given form is provided for accomplishing a more accurate digital-to-analog conversion of a digitized signal at a higher speed and over a wider frequency range at a comparable data rate to relatively lower speed and narrower frequency range conventional systems. The method comprises the steps of emphasizing the analog input signal to form a high frequency emphasized signal; processing the emphasized signal to form a 1-bit digital signal; and low pass filtering the digital signal to obtain an analog signal of a form substantially the same as the form of the analog input signal without use of a multi-bit dequantizer for digital-to-analog conversion. The invention also provides a novel 1-bit, high speed processing system for carrying out the foregoing method.

12 Claims, 9 Drawing Sheets

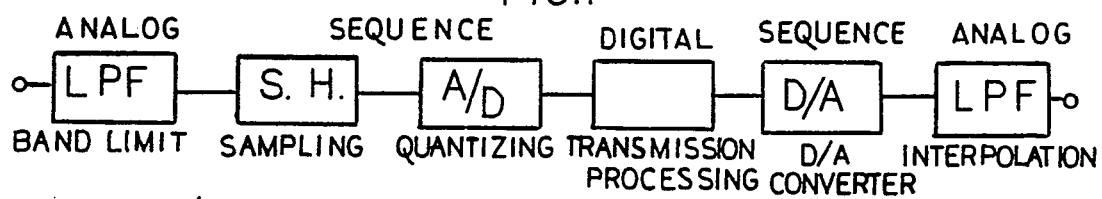
FIG. 1
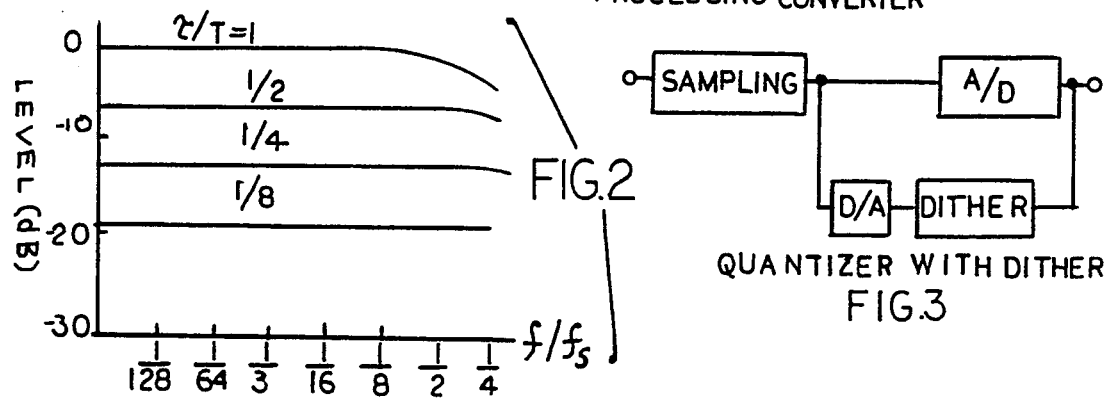
FIG. 2
FIG. 3
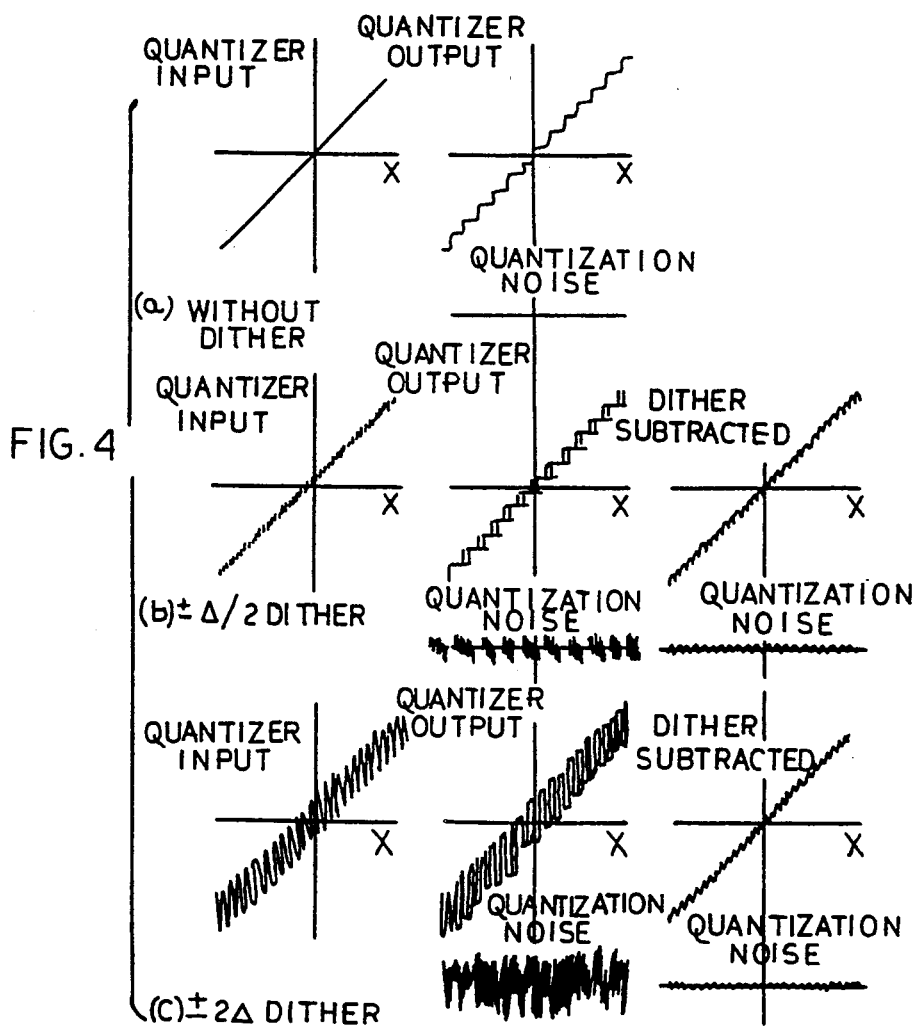
FIG. 4

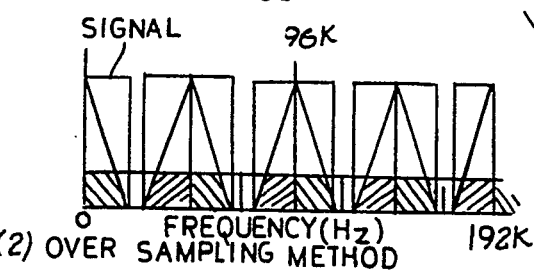
(1) BASIC METHOD
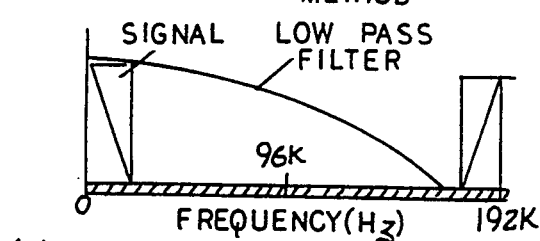
(2) OVER SAMPLING METHOD
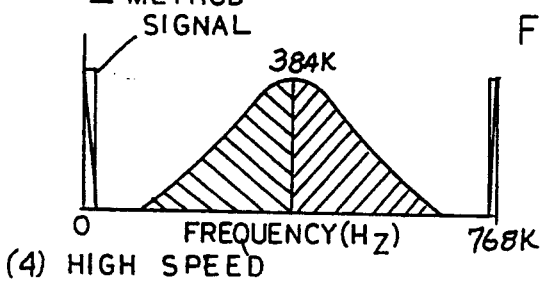
(3) ΣΔ METHOD
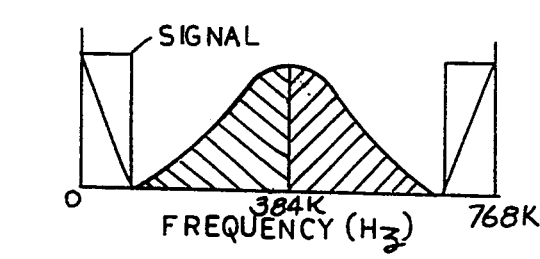
(4) HIGH SPEED 1BIT METHOD
FIG. 8
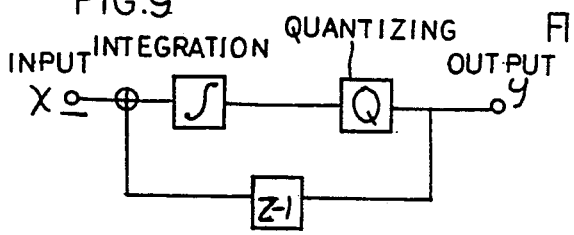
BASIC CONSTRUCTION OF ΣΔ MODULATION
FIG. 9
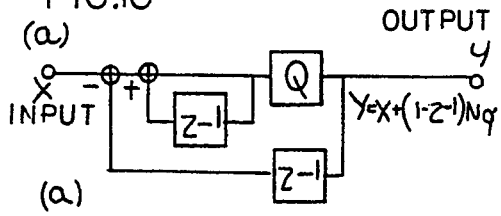
1ST ORDER DIGITAL ΣΔ MODULATION
FIG. 10
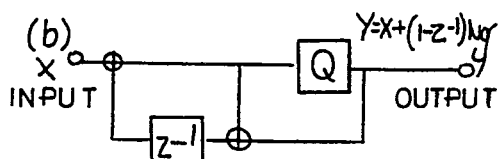
QUANTIZING 1 SAMPLE DELAY ΣΔ AD CONVERTER
FIG. 11
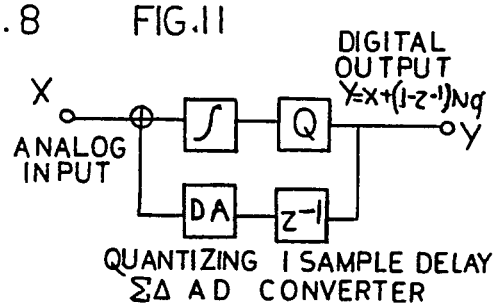
2ND ORDER ΣΔ MODULATION
FIG. 12

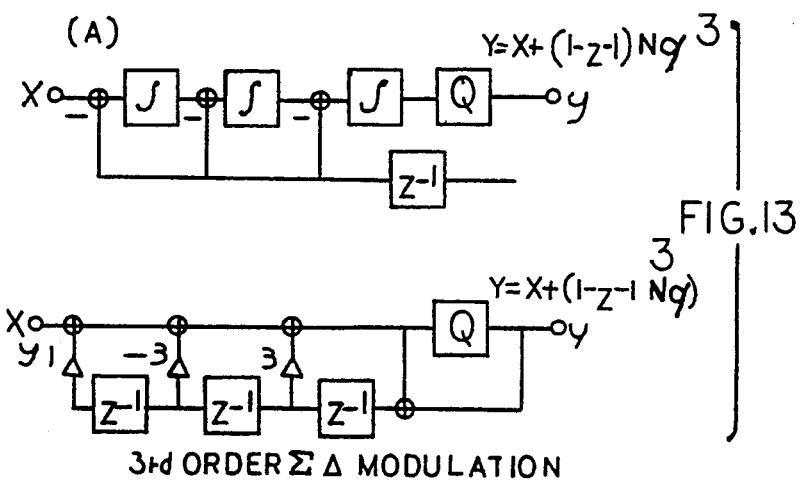
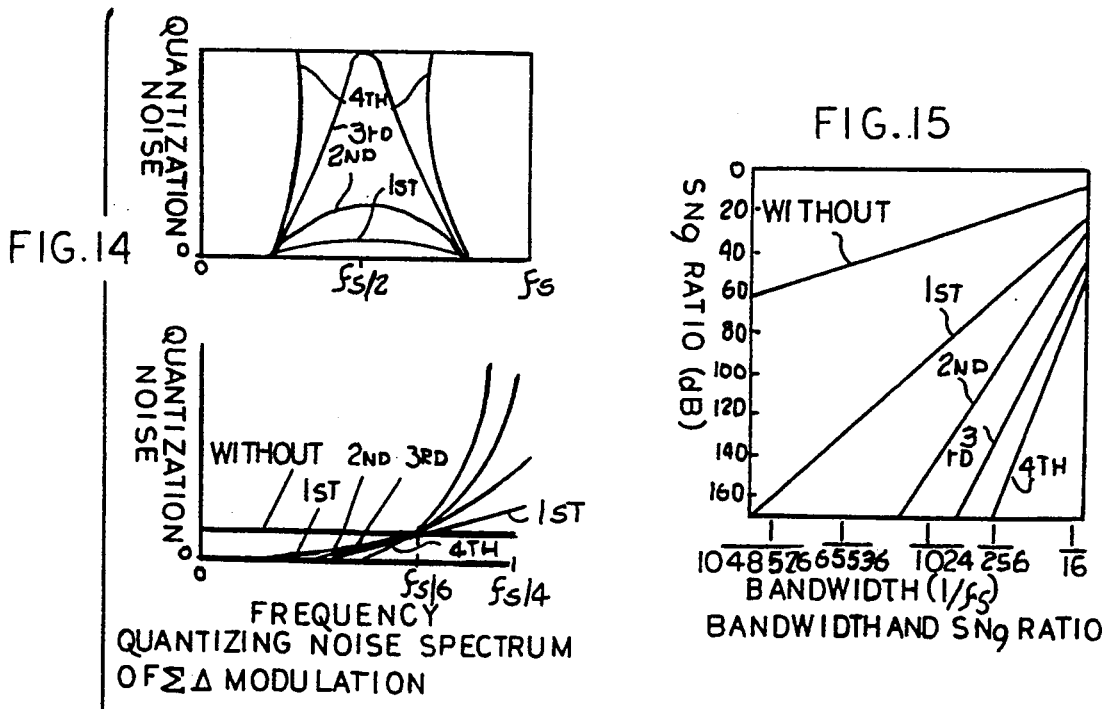
FIG.13 — 3rd ORDER ΣΔ MODULATION
FIG.14 — QUANTIZING NOISE SPECTRUM OF ΣΔ MODULATION
FIG.15 — BANDWIDTH AND SNq RATIO
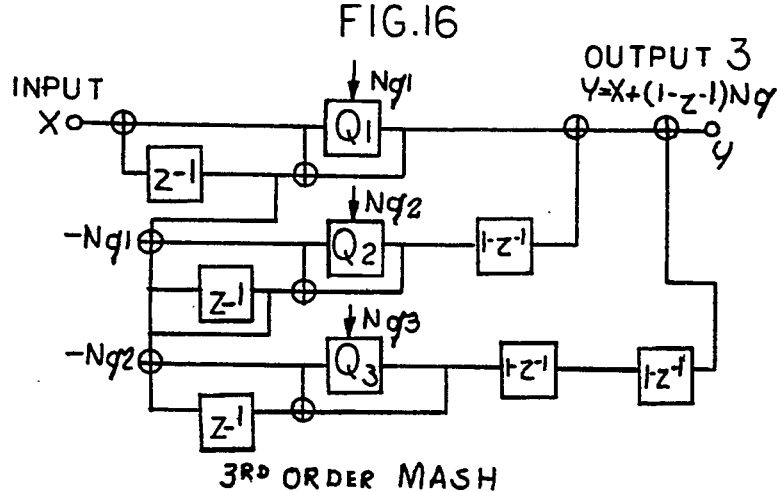
FIG.16 — 3RD ORDER MASH

4TH ORDER 1-BIT ΣΔ MODULATION

FIG.22
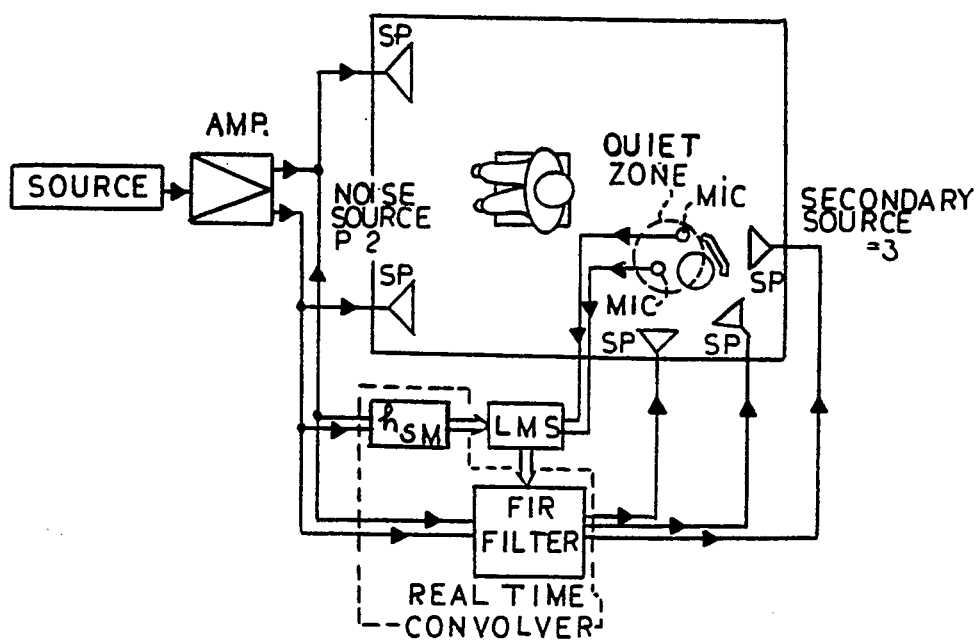
FIG.23
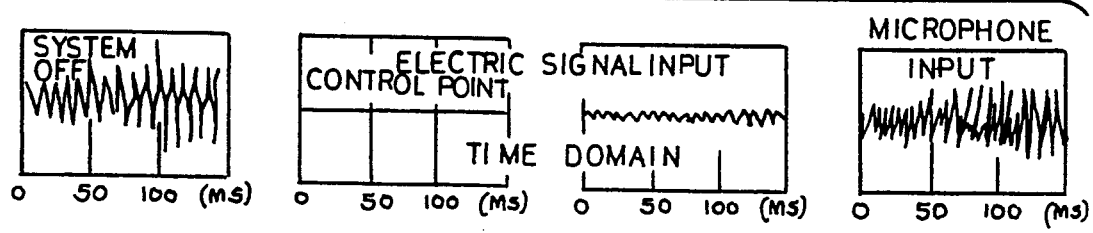
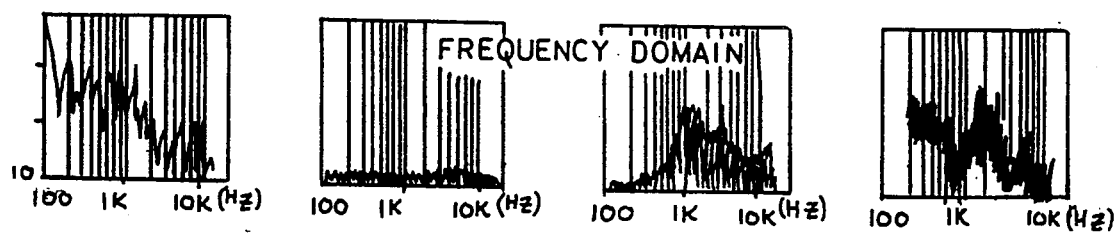

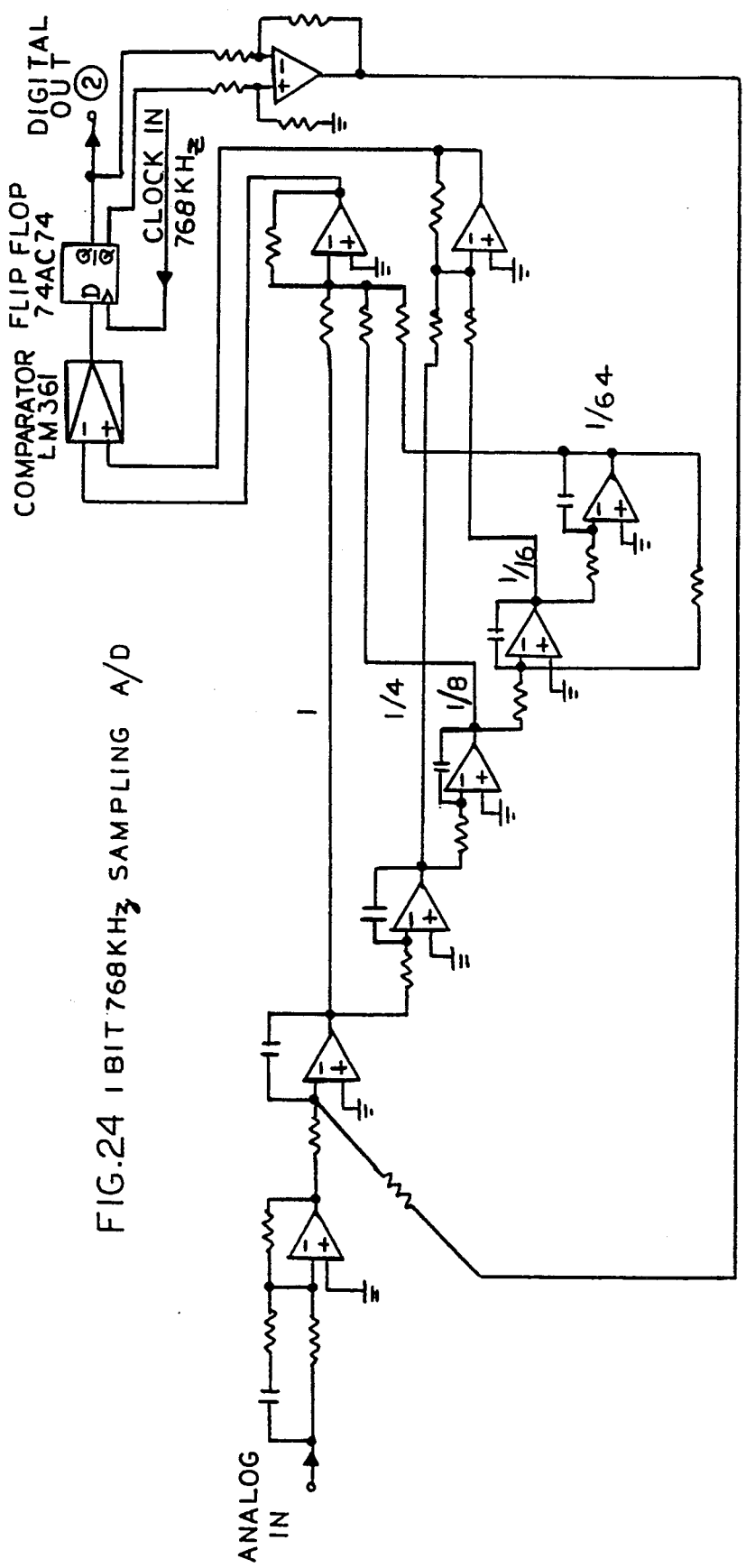
FIG. 24 1 BIT 768KHz SAMPLING A/D
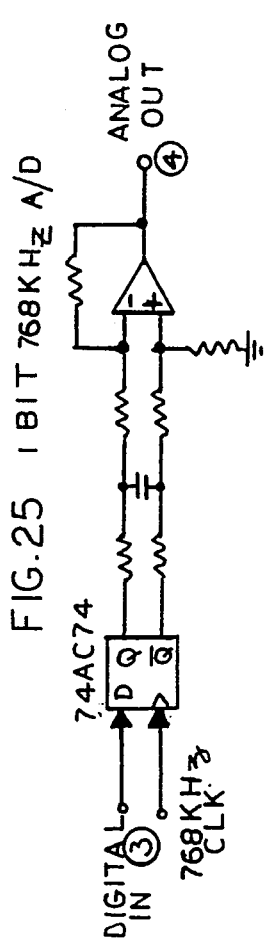
FIG. 25 1 BIT 768KHz A/D FIG. 26
WAVE FORMS of FIGS 24&25
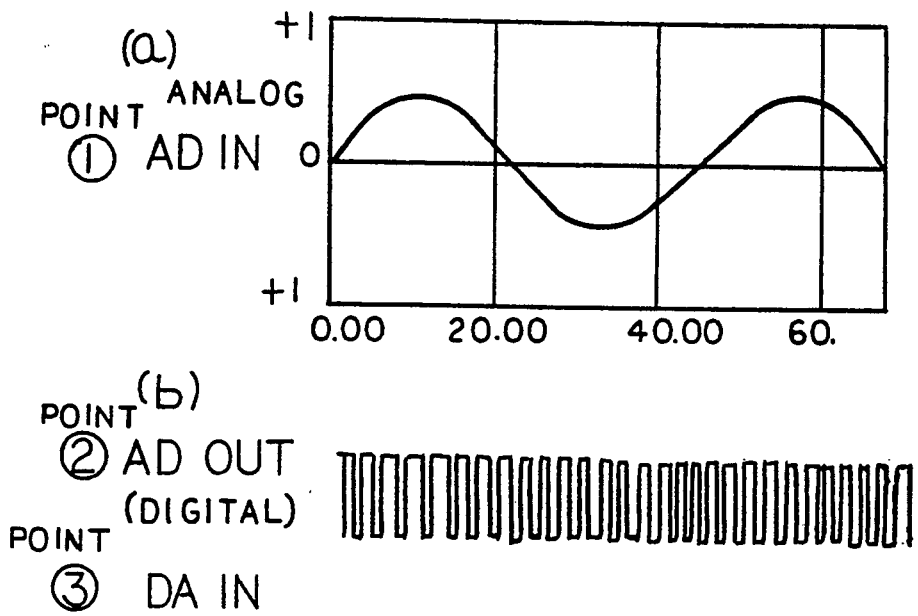
(a) POINT ① AD IN ANALOG
(b) POINT ② AD OUT (DIGITAL)
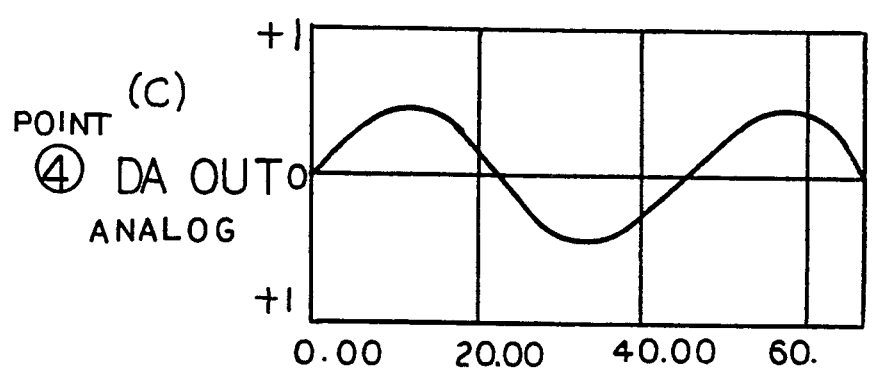
POINT ③ DA IN
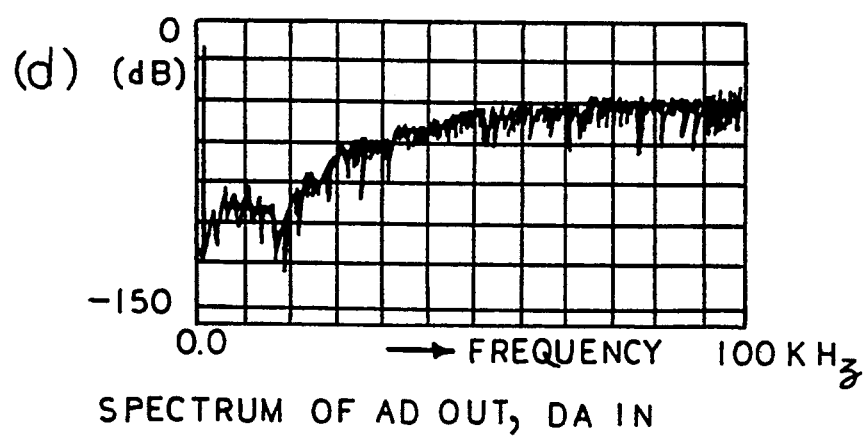
(c) POINT ④ DA OUT ANALOG
(d) (dB)
SPECTRUM OF AD OUT, DA IN

ONE BIT HIGH SPEED SIGNAL PROCESSING SYSTEM UTILIZING CONTROLLED SPECTRUM OF QUANTIZATION NOISE

BACKGROUND OF THE INVENTION

This invention is directed generally to analog-to-digital and digital-to-analog (AD/DA) conversion systems and high speed processing, and more particularly to a 1-bit high speed signal processing method and system. The application also addresses an application of such signal processing in recording, broadcasting, sound reenforcement, musical instruments, video signal processing and active control of sound and vibration.

In digital signal processing, the effect of finite word length must always be taken into consideration. In AD/DA conversion, the limitations of finite word length appear generally as quantization noise which diminishes the quality of the conversion and accuracy of reproduction of the original analog signal following AD/DA processing. While a number of types of AD/DA converters have been utilized, more recently a Sigma Delta modulation type converter has been developed, which concentrates quantization noise in the high frequency areas by setting a quantizer in the feedback loop. This may be especially useful in audio applications wherein the bulk of the useful information is in the lower frequency portion of the spectrum. The delay experienced in digital signal processing has always posed a problem, particularly in active control of audio sound fields.

OBJECTS AND SUMMARY OF THE INVENTION

It is a general object of this invention to provide a novel method and system for AD/DA conversion considering the spectrum of the quantization noise and a novel method and system for achieving high speed signal processing suitable for use in recording, broadcasting, sound reenforcement, musical instruments, video signal processing and active sound field control systems.

Other objects of the invention are:
- to achieve higher speed and wider bandwidth signal processing with comparable data rate to lower speed, lower frequency range conversion systems;
- to improve error immunity both in theory and in human perception, by using a 1-bit system without digital "words" which normally are made up of 8 to 20 bits;
- to simplify DA converter hardware, for example, the simplest embodiment of the circuit of the invention requires only one resister and one capacitor for DA conversion (e.g., FIG. 18b);
- to simplify arithmetic processing especially in multiplying.

A related object is to provide a novel high speed 1-bit conversion system and method for AD/DA conversion.

Another related object is to provide a novel and improved acoustic signal processing, such as a real time convolution system and method for sound field control.

In summary, the invention provides a D/A converter system comprising a moderately sloped low-pass filter, a 1-bit AD/DA conversion system suitable for the above-described uses, and quantitizing noise spectrum control, for example, for complementing human hearing characteristics.

BRIEF DESCRIPTION OF THE DRAWINGS

The features of the present invention which are believed to be novel are set forth with particularity in the appended claims. The organization and manner of the operation of the invention, together with further objects and advantages thereof may best be understood by reference to the following description, taken in connection with the accompanying drawings in which like reference numerals identify like elements, and in which:

FIG. 1 is a functional block diagram illustrating in a normal flow of signal processing in an AD/DA signal processing system;

FIG. 2 is a graphical illustration of the aperture effect in such a system;

FIG. 3 is a block diagram of an A/D quantizer with dither;

FIG. 4 is a series of waveform diagrams illustrating quantization with and without dither;

FIG. 8 shows a series of frequency spectra associated with the performance of the respective systems of FIG. 7;

FIGS. 9 through 13 are block diagrams illustrating various forms of Sigma Delta modulation circuits;

FIG. 14 illustrates the quantizing noise spectrum of Sigma Delta modulation;

FIG. 15 is a graph illustrating band width and SN ratio without and with first through fourth orders Sigma Delta modulation;

FIG. 16 shows the construction of a system known as MASH to secure high order stable operation of Sigma Delta modulation;

FIG. 22 is a diagram illustrating an application of real time convolution hardware for sound field control in accordance with another aspect of the invention;

FIG. 23 is a series of spectral diagrams of experiments carried out with the arrangement of FIG. 22.

FIG. 24 is a circuit schematic of a detailed embodiment of a circuit for 1-bit 768 kHz sampling A/D conversion;

FIG. 25 is a circuit schematic of a detailed embodiment of a circuit for 1-bit, 768 kHz D/A conversion; and FIG. 26 is a series of graphs showing signal waveforms at several points in the circuits of FIGS. 24 and 25.

DETAILED DESCRIPTION OF THE ILLUSTRATED EMBODIMENT

Figure 5:
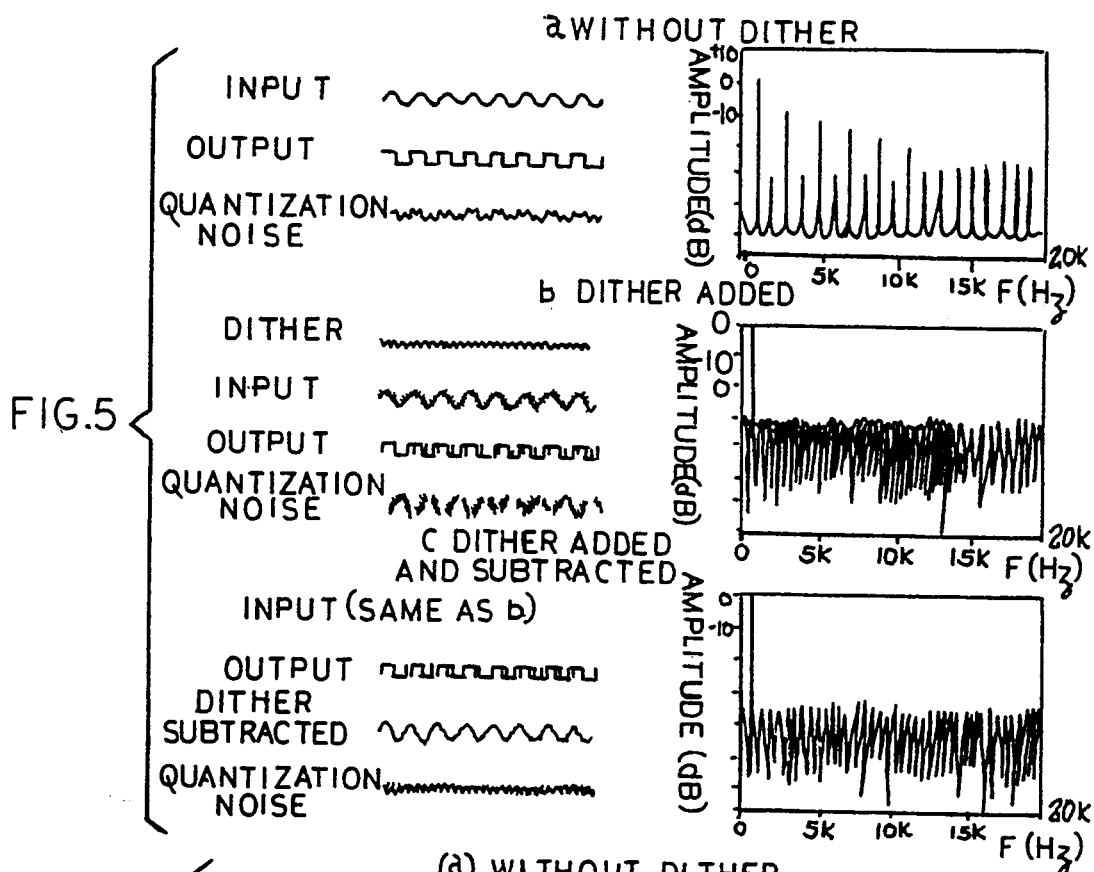
FIG. 5 is a series of waveform diagrams and spectrum analyses showing quantization of a sine wave signal with and without dither.

Referring now to the drawings and initially to FIG. 1, the creation of a digital signal generally involves the representation of an analog signal in the form of discrete 8 to 20 bits digital numbers, i.e., zeroes and ones. In order to digitize analog signals, steps of sampling and quantizing are necessary as indicated in the diagram of FIG. 1. Generally, speaking, the sampling frequency determines the band width of the signal and the number of quantizing bits determines its dynamic range; however, the two are closely related.

Sampling

A series of sampled analog signals is called a sequence. In general, the frequency band of an acoustic signal is finite and sampling without any signal degradation is enabled based on the sampling theorem. That is, signal x(t) in band $\frac{1}{2}$T(Hz) can be expressed as indicated in equation (1) in the table of equations, Table 2 attached hereto. Thus, the original signal x(t) is reproduced by passing a sequence x(nT) through an ideal low pass filter of $\frac{1}{2}$T(Hz) band width.

A perfect band limitation sampling by impulse and interpolation by a pulse stream without width and an ideal filter of course cannot be realized in practice. If the band limitation is not sufficient, the signal component over one-half of the sampling frequency is in effect folded over to a signal band under one-half of the sampling frequency. This phenomenon is called an aliasing noise, and it cannot be isolated after sampling. If a pulse of width tau(s) is used, the reproduced output y(t) for a pure tone x(t)=cos 2pift is as shown in equation (2) (Table 2). A time delay of tau/2(s) and attenuation of the high frequency component occur as shown in FIG. 2. This phenomenon is called the aperture effect. Usually the high frequency attenuation is compensated by a filter or analog gate after the D/A converter, the width of this gate (tau/T) is one-tenth to one-fourth.

Quantization Noise and Dither

Since quantization is an operation that represents continuously distributed sampled values by discrete number, some signal degradation is inevitable. The difference between quantization output and input sampled value is called quantization noise. Quantization output $X_q$ and quantization noise $N_q$ normalized in quantization step width Delta in a midriser type of uniform quantizer are as shown in equations (3) and (4) (Table 2).

The brackets in equation (3) indicate a Gaussian symbol and the subscript f indicates increments or values below the quantization step. As indicated in equation (4), quantization noise is determined primarily by input X, that is, quantization noise is a deterministic function of input X. If the level is low, the quantization noise correlates strongly to the input signal. As shown in FIG. 3, with dither D added to the input before the quantization, equations (3) and (4) become equations (5) and (6) (see Table 2). When the added dither is subtracted, the equation (6) becomes equation (7) (see Table 2).

If a probability density function is used as dither D, the quantized value $X_q$ and quantization noise $N_q$ do not become deterministic. If $D_f$ is distributed uniformly in 0 and 1 in equation (7), the quantization noise is distributed uniformly in ±Delta/2 independently of input. That is, it is desirable that dither D be a probability density function distributed uniformly in ±Delta/2 or its integral multiple. If a probability density function is distributed uniformly in Delta or its integral multiple as $Delta_f$ is used as dither, $N_q$ is distributed uniformly in Delta and its power becomes $Delta^2/12$. In other words, troublesome quantization noise can be made white noise without any correlation to the input signal if proper dither is introduced. FIG. 4 shows an input/output characteristic and quantization noise, (a) without dither, (b) with ±Delta/2 dither and (c) with a pseudo random sequence in a uniform distribution of ±2Delta as dither.

Figure 6:
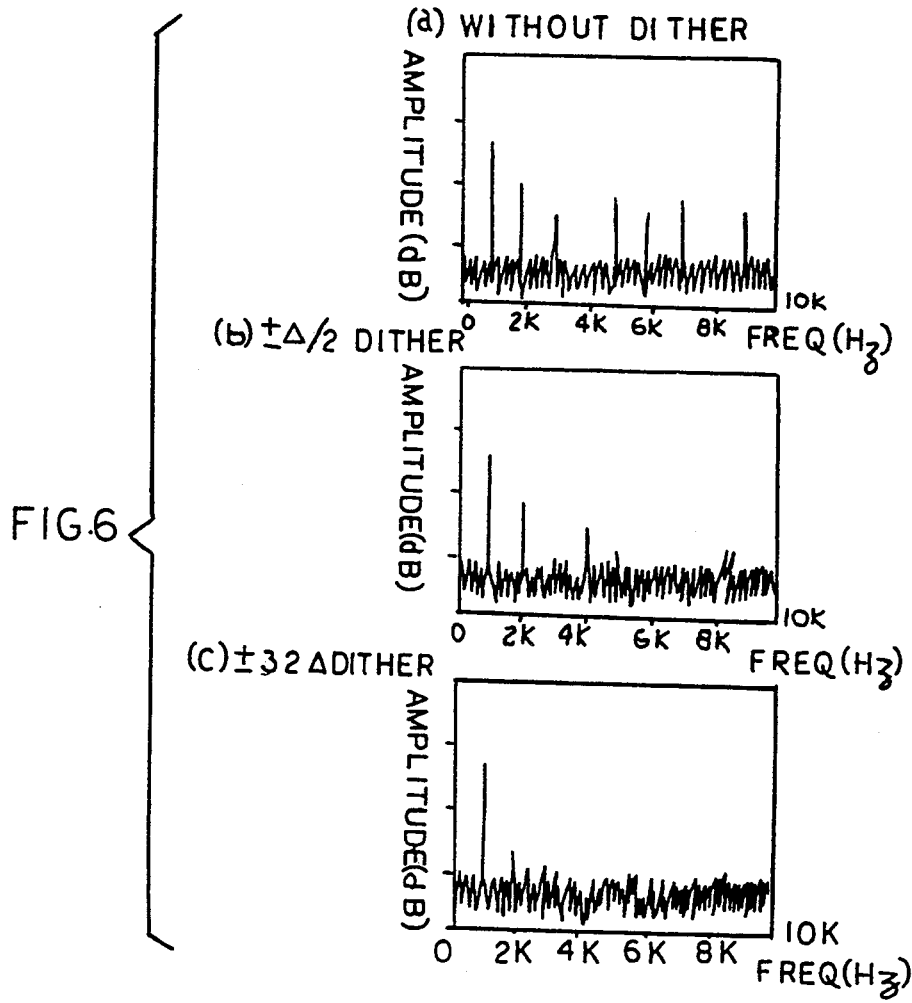
FIG. 6 is a series of spectral waveforms illustrating the effect on quantization of varying amplitudes of dither.

FIG. 5 shows the quantized waveform of a sine wave with an amplitude of Delta/2 and FIG. 6 shows the frequency spectrum of quantization output simulated by computer when the signal frequency is set to 1 kHz and the sampling frequency to 40.96 kHz. In FIG. 6(a) is without dither, (b) adds dither of ±Delta/2, and (c) subtracts dither after quantization.

Without dither the output is as if a square wave were input, though the input is the sine wave, that is, higher harmonics of odd number occur. The components over $\frac{1}{2}$ of the sampling frequency are folded down.

If dither is added and not subtracted, the quantized waveform differs greatly from the input sine wave and quantization noise seems to correlate to the input sine wave to some extent, but the spectral distribution indicates only that quantization noise is made white.

If dither is added and subtracted, the two defects above mentioned disappear: the blind band that occurs if dither is not added, and the input amplitude dependence on the quantization noise if dither is not subtracted, and the resolution below the quantization step comes out. Thus, if an averaging technique is also used, greater precision over the resolution of the A/D converter to be used can be expected.

The purpose of introducing dither is not to mask distortion, but to eliminate correlation between input and quantization noise. It can be said that addition and subtraction of dither is an indispensable process of digitation of analog signals. But dither has not heretofore been provided in many systems.

Not only in A/D or D/A conversion but also in any digital signal processing especially in fixed point calculation, the dither technique is very important.

Introduction of Large Amplitude Dither

A conversion error exists in actual A/D and D/A converters such that they vary from the ideal quantization characteristics. FIG. 4 shows the conversion characteristics of A/D converters a) without dither, b) with ±Delta/2 dither and c) with ±2Delta dither.

So the quantization step is not the same and it is impossible to introduce dither uniformly distributed in ±Delta accurately. If subtraction of dither is possible, the relative distribution precision is improved by introducing dither of fairly large amplitude, and not only is the above-described effect of dither itself realized, but also improvement of the averaging errors of the A/D and D/A converters, and improvement of their precision can be expected. The larger the dither distribution is, the more effective the averaging of errors becomes, and it is necessary that the required distribution precision is low. If dither distribution is too large, the overload level of a signal decreases. A uniform distribution of about four quantization bits under the full load level is appropriate.

FIG. 6 shows the results of experiments with a 16-bit module type of A/D converter. Input is a 1 kHz sine wave of overload level −66 dB, the sampling frequency is 44.1 kHz, and (a) is the spectral distribution of quantization output without dither. Harmonic distortion appears that seems to be due to the conversion error of the converter in addition to quantization noise, (b) is the result from adding and subtracting ±Delta/2 dither that is theoretically optimal and least. The quantization noise is to have been made white, while harmonic distortion remains that seems to be due to the conversion error, (c) is the result from adding and subtracting ±32 Delta dither. Harmonic distortion is significantly reduced.

HIGH SPEED AD/DA CONVERSION

Spectrum of Quantization Noise

When there are enough quantizing steps or the proper dither, that is, a probability density function distributed uniformly within a quantizing step or its integer multiple, is added before and subtracted after quantizing, the quantization noise of a uniform quantizer becomes white with no correlation to input signal, and the frequency range from 0 to $f_s/2$ ($f_s$:sampling frequency) is (Delta)$^2$/12 where Delta is the quantizing step. It means that the higher the sampling frequency is, the less the quantization noise in the signal band becomes. In theory, it is possible to reach more than 100 dB dynamic range even with 1-bit, but the sampling frequency becomes of the GHz order, which is impossible to realize in practice.

If by some method the quantization noise could be concentrated at higher frequencies, it might be possible to get a sufficient dynamic range in the audio signal band with a lower, and more practical sampling frequency. When Sigma Delta modulation is introduced, the total power of the quantization noise increases, but the noise concentrates in the higher frequencies and the components in the lower frequencies decreases.

Figure 7:
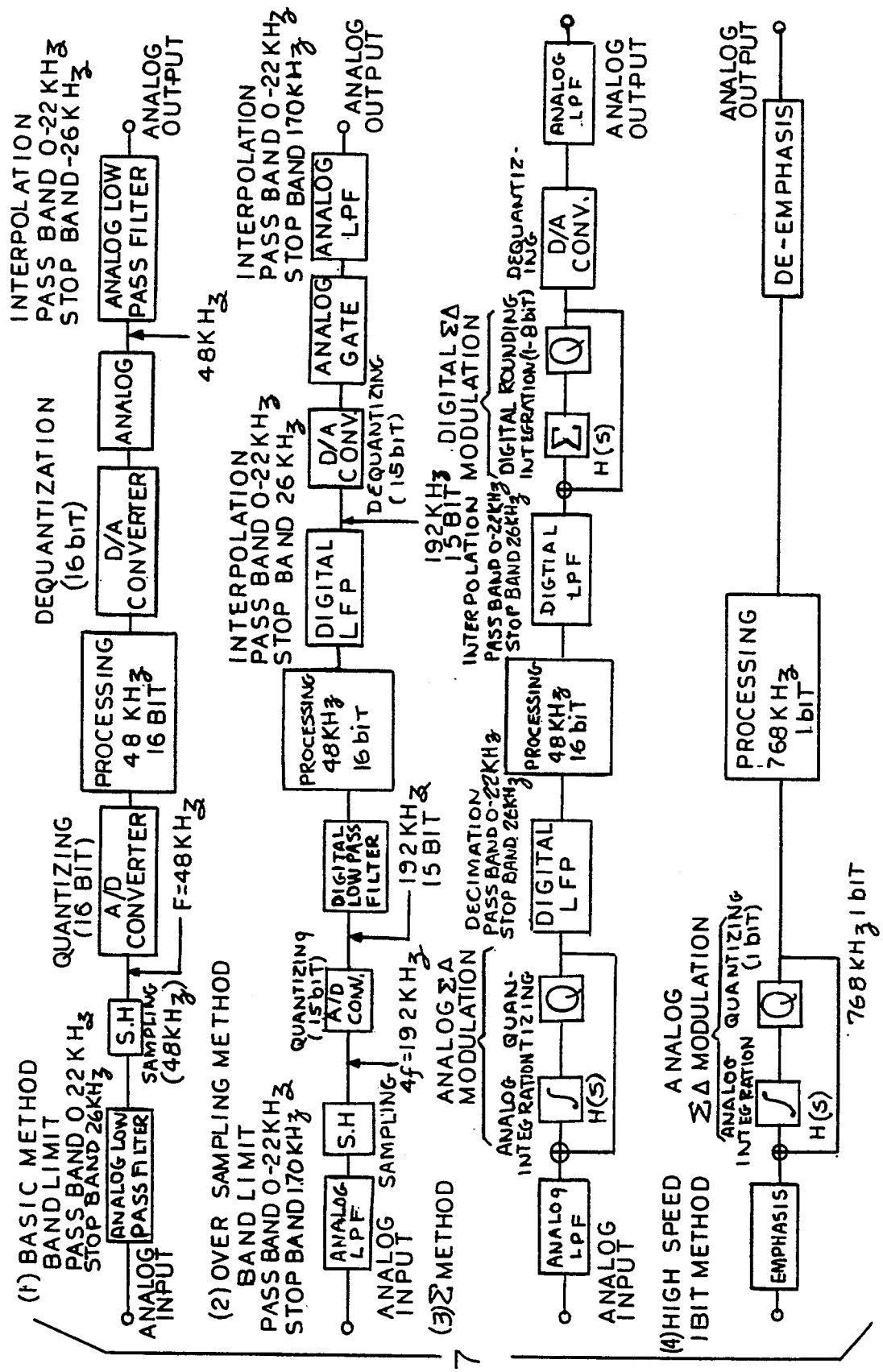
FIG. 7 is a series of block circuit diagrams illustrating various forms of AD/DA conversion systems in accordance with the prior art and one form in accordance with the present invention.

The constructions of four types of AD/DA conversion systems are shown in FIG. 7 and their frequency spectra in FIG. 8. An explanation of the systems shown in FIGS. 7(1), 7(2) and 7(3), each of which uses 48 kHz sampling, 16-bit quantizing, as presently used in DAT and satellite broadcast systems for example, follows:

The system shown in FIG. 7(1) is a basic system. In modulation, the input analog signal is band limited by an analog filter, sampled by a sample and hold circuit at a 48 kHz rate and quantized by 16-bit quantizer, which is commonly called an AD converter, although it is such only in a narrow sense. In demodulation, the digital signal is dequantized by a DA converter by a 48 kHz, 16-bit pulse sequence (PAM wave), which is generated by an analog gate and interpolated by an analog low pass filter. In order to avoid the influence of aliasing, the analog filter is required to have sharp cutoff characteristics and a high order Chebyshev type filter is usually used.

The system shown in FIG. 7(2) is what is called an over-sampling system. In modulation, the input analog signal is sampled with a higher sampling multiplied by an integer), band limited by a digital low pass filter called a decimator, and converted to a 48 kHz, 16-bit format. In demodulation, using 4 times over-sampling for instance, a "4 times" sample sequence is made by a digital interpolation filter and a dequantizer. Thus, a so-called D/A conversion is done with 4 times sampling frequency. In this case band limiting and interpolation are done by digital filters, eliminating the requirement for high order analog filters having sharp response curves.

The bit number of the quantizer can be reduced according to the sampling frequency, i.e., when a quantizer of a given precision is used, the precision of the quantizing is raised in proportion to the sampling frequency. AD/DA converters with from 2 to 16 times sampling frequency are widely used in audio equipment.

The system shown in FIG. 7(3) is a Sigma Delta modulation system, which gives differential characteristics, (that is, increasing the higher frequency component) to the quantization noise by setting the quantizer in the feedback loop. This technique is called noise shaping. A wider dynamic range can be obtained with the same number of bits by raising the sampling frequency.

Similar to the system in FIG. 7(2), band limiting and interpolation are done by a digital filter, but the sampling frequency is usually set much higher, and the load on the analog filter is further reduced. In many cases the analog anti-aliasing filter and sample-hold circuit can be omitted.

The accuracy of the converters of FIGS. 7(1) and 7(2) depends on the precision of resistance and of charge and discharge of capacitors, but in Sigma Delta modulation as in FIG. 7(3) the accuracy of the quantizer depends on the precision of the time axis.

Basic Construction of Sigma Delta Modulation Circuits

A simplified, basic construction of a first order Sigma Delta modulation circuit is shown in FIG. 9. It is comprised of an integration circuit, a quantizer and a feedback loop with a one sample delay and subtractor. The digital construction of a Sigma Delta modulation circuit is shown in FIG. 10(a), and an associated delay circuit in FIG. 10(b). This construction is directly used in D/A conversion and signal processing.

The construction of a circuit for A/D conversion by Sigma Delta modulation is shown in FIG. 11. I have recognized that when the quantizer is a 1-bit quantizer, a flip-flop can be also used as the D/A converter.

When the quantizer produces quantization noise $N_q$ which is not correlated with the input signal, the output signal Y of the first order Sigma Delta modulation is as shown in equation (8) and the quantization noise $N_q$ becomes as shown in equation (9).

As mentioned above, when the number of the quantizing steps is large enough or the proper dither is introduced, the quantization noise is white and the total power of from 0 to $f_s/2$ is (Delta)$^2$/12 and its spectrum density is (Delta)$^2$/$f_s$. The power spectrum of the quantization noise of the first order Sigma Delta modulation $N_q(f)$ is therefore as shown in equation (10). The distribution of quantization noise decreases in the lower frequency range and increases in the higher frequency range with $f=f_s/6$ as the turning point.

$N_qf$, the power of the quantization noise in the frequency range from 0 to f is calculated by integration of equation (10) as shown in equation (11). The total power of quantization noise in the range of 0 to $f_s/2$ is Delta/6, twice as much as (Delta)$^2$/12 in the case of normal quantizing.

On the other hand, in the low frequency range, the following approximation can be done, sin $2\pi f/f_s = 2\pi f/f_s$ then $N_qf$ is as shown in equation (12). The power of the maximum amplitude sinusoidal wave represented by M bits is $(2^M-1)2(Delta)^2/8$, so S/$N_q$ in the lower frequency in dB is as shown in equation (13). When the sampling frequency is doubled, $S/N_q$ is improved by about 9 dB. In order to get 100 dB $S/N_q$ in the 20 kHz band by 14-bit quantizing, about 160 kHz sampling frequency is required, or, by 1-bit quantizing, about 112 MHz sampling frequency is necessary.

The construction of a second order Sigma Delta modulation circuit is shown in FIG. 12. Here the modulation output Y is as shown in equation (14). The quantization noise takes the form of second order differentiation.

As in case of the first order, the power spectrum of the quantization noise is obtained as shown in equation (15). The power of the quantization noise $N_{qf}$ in the frequency range from 0 to f is as shown in equation (16). The quantization noise in the range 0 to $f_s/2$ is (Delta)$^2$/2, which is six times as much as normal quantizing without Sigma Delta conversion.

On the other hand, in the low frequency range, $N_{qf}$ is as shown in equation (17). The $SN_q$ ratio to the maximum amplitude sinusoidal wave in the lower frequency range is as shown in equation (18). When the sampling frequency is doubled, about 15 dB improvement is achieved. An $SN_q$ ratio of 100 dB in a 20 kHz band can be obtained by about a 6.7 MHz sampling frequency with 1-bit quantizing.

Similarly, as is shown in FIG. 13, a third or higher order Sigma Delta modulation can be considered.

Table 1 shows the relation between input and output signal, the spectrum of quantization noise, quantization noise power of 0 to $f_s/2$, quantization noise in low frequency range of 0 to $f_s/32$ of 1-bit Sigma Delta modulation.

FIG. 14 shows the different power spectra of the quantization noise according to the different orders of 1-bit Sigma Delta modulation.

FIG. 15 shows the relation between frequency band width of signals and the $SN_q$ ratio. When the order of Sigma Delta modulation is increased, the total power of quantization noise increases, but the distribution in the lower frequency shows a rapid decrease with the turning point of $f_s/6$.

High Order Sigma Delta Modulation

Sigma Delta modulation below the second order is stable, but at third order or above often becomes unstable because of the limit of the quantizing steps and the correlation of the quantization noise with the input of the quantizer. Recently various techniques have been introduced for high order stable Sigma Delta modulation.

Figure 17:
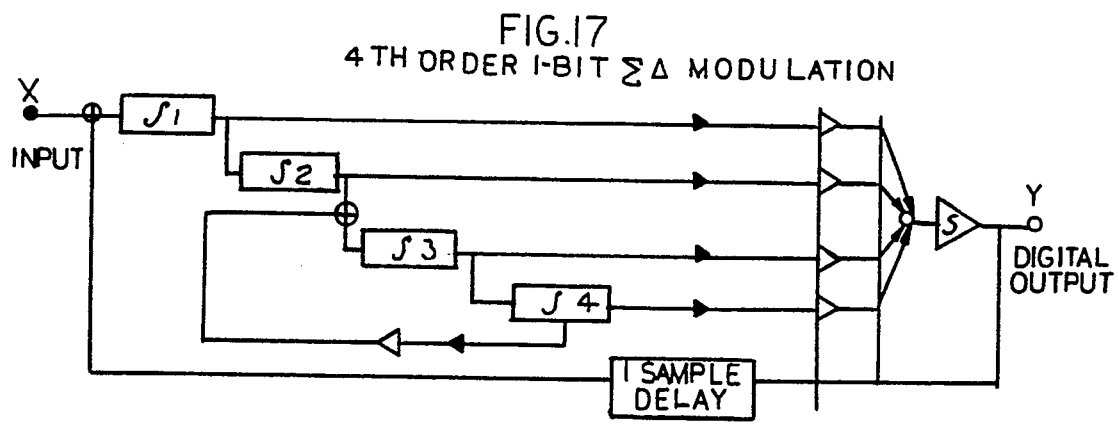
FIG. 17 is a block diagram of a fourth order 1-bit Sigma Delta modulation system.

FIG. 17 shows the construction of a stable fourth order Sigma Delta A/D converter, type 5326 of Crystal Co. or Asahi-kasei.

MASH (multi stage noise shaping) is a method devised by Matsutani, Uchimura and Murata of NTT. As is shown in FIG. 16, to secure high order stable operation, Sigma Delta modulator is serially connected with several stages so as to modulate the quantization noise of each former stage, and the output of each stage is differentiated by the number of times corresponding to the number of the stage, then summation is done. The output signal of each quantizer is as shown in equation (19). $Y_2$ is first order and $Y_3$ is second order differentiated and added to $Y_1$ and the final output signal Y is as shown in equation (20). The quantization noise of quantizers $Q_1$ and $Q_2$ is removed and the third order Sigma Delta modulation is produced.

HIGH-SPEED 1-BIT PROCESSING

High Speed 1-Bit Conversion

As noted above, FIG. 15 shows that in order to get a 100 dB dynamic range with a 20 kHz band width by 1-bit quantizing, the sampling frequency must be higher than 112 MHz with first order Sigma Delta modulation, 6.7 MHz with second order, 2.0 MHz with third order, 1.1 MHz with the fourth order and 713 kHz with fifth order.

However, this invention recognizes the possibility of a higher order processing system with lower bit rates. This invention further recognizes the possibility of using the output of the Sigma Delta modulation itself as the digital signal, as is shown in FIG. 7(4), instead of limiting the output band and changing it into a digital signal of the ordinary 48 kHz sampling frequency and 16-bit form.

No matter what order Sigma Delta modulation is used for A/D conversion, the only difference appears in the spectrum of quantization noise.

Furthermore, in any case, this invention recognizes that a dequantizer is not necessary for D/A conversion, and that the analog signal can be obtained by band limiting the digital output.

In digital signal processing, multiplication is very difficult. It is therefor advantageous that all multiplication is done by 1 in a 1-bit system. For example, convolution with little delay is made possible and this is advantageous in the sound field control, one example of which is discussed below.

Figure 18:
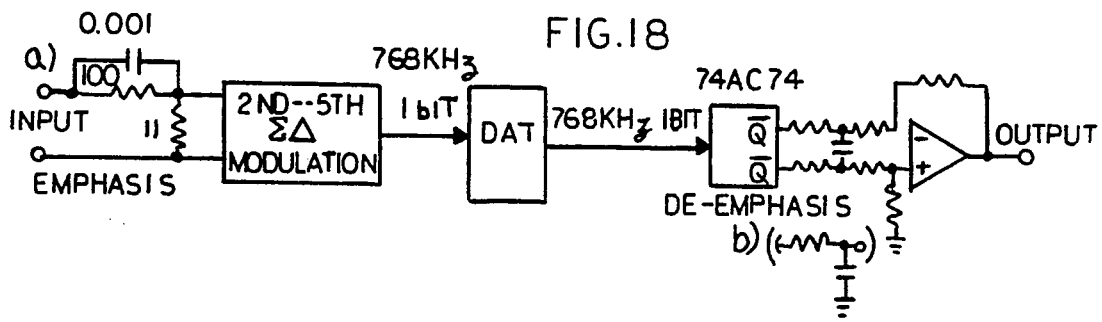
FIG. 18 is a circuit diagram, partially in block form illustrating a high speed 1-bit processing system in accordance with the invention.
Figure 19:
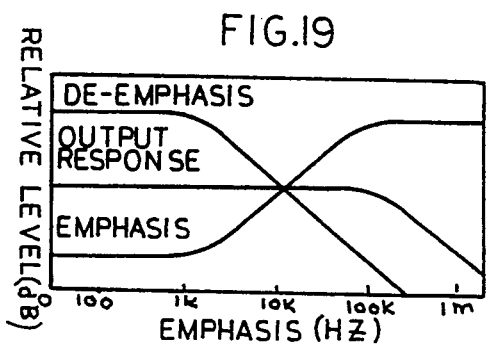
FIG. 19 is a graphic representation of characteristics of emphasis and de-emphasis.

FIG. 18 shows a processing system in accordance with the invention. Emphasis and de-emphasis which also work as a band limiting filter, as shown in FIG. 19 are introduced.

Figure 20:
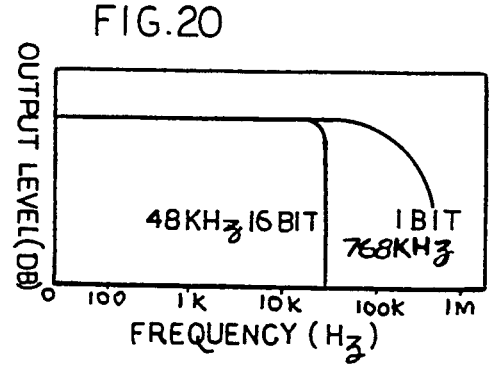
FIG. 20 is a graph of frequency response of a 16-bit system in accordance with the prior art and the 1-bit system in accordance with the invention.

FIG. 20 shows frequency transmission characteristics of a 1.536 MHz, 1-bit system with fourth order Sigma Delta modulation.

Figure 21:
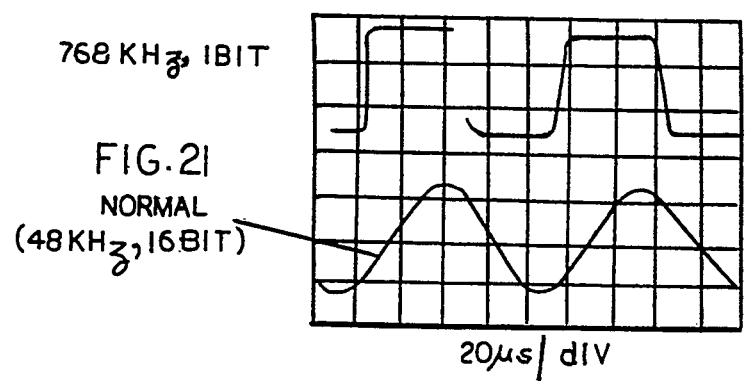
FIG. 21 is a reproduction of an oscilloscope screen illustrating response to a square wave input of the system of the invention and of a prior art system.

FIG. 21 shows the output waveform of the system of FIG. 18 and of a "normal" 48 kHz, 16-bit system for a 10 kHz square wave input. By using the system of the invention, the output waveform is nearly the same as the original input, while by the "normal" 48 kHz 16-bit system only the fundamental frequency is observed.

A more detailed circuit diagram of a processing system similar to that of FIG. 18 is shown in FIGS. 24 (1-bit, 768 kHz sampling A/D) and 25 (1-bit, 768 kHz D/A). It is of particular note, that the 1-bit system of the invention can be realized using only relatively simple and inexpensive flip-flop OP-AMP (integrator and comparator) IC's, and does not require a complex multibit quantizer. In fact, a flip-flop component acts as a 1-bit quantizer.

Real Time Convolution Hardware for Sound Field Control

In active noise control in sound fields, tremendous convolution calculation is necessary, especially to control live sound fields. Convolution can be done by Fast Fourier Transform ("FFT"). Though FFT is a very efficient calculation, time delay occurs. Therefore, a direct convolution system with over one thousand Digital Signal Processing ("DSP") chips has been developed for this purpose.

In the case of a controlled sound field within a room or other enclosed space, noises through windows and doors or otherwise entering the room from outside are often the object of active sound field control. But such kind of noises, which may come from various directions and be randomly moving and changing, are very difficult to control. On the other hand when the noise sources can be characterized as electrical signals, such as TVs and audio equipment, it is possible to control such noise even in live sound fields, by a real time convolution system.

FIG. 22 shows a block diagram of an active noise control system; two noise sources are loudspeakers (sp), and three additional loudspeakers (sp) are placed to control the sound field within a quiet zone. Two microphones (mic.) are located within the quiet zone. FIG. 23 is the result of experiments carried out in a wood-enclosed room having a volume of 115 m$^3$ with 0.3 sec. reverberation time.

In FIG. 22, a real time convolution (convolver) circuit comprises an impulse response circuit $h_{sm}$ and a first impulse response (FIR) filter. A least mean square (LMS) circuit is also utilized. The real time convolution circuits can advantageously be realized as 1-bit high speed AD/DA conversion and 1-bit digital signal processing circuits in accordance with the above-described invention.

This kind of active control system can be applied to a quiet zone for telephone conversations while listening to TV or stereo, or to making a quiet zone at a disco or Karaoke bar.

In spite of their relatively low frequencies, acoustic signals are hard to treat even with the most recent developments of signal processing techniques, especially in complicated sound fields. The present invention represents an innovative attempt at progress in this regard.

While active sound field control is one useful application of the invention, there are many others. As mentioned above, the high speed signal processing made possible by the invention may also be applied to recording, broadcasting, sound reenforcement, musical instruments and video signal processing.

REFERENCES

1) Y. Yamasaki, "The application of large amplitude dither to the quantization of wide range audio signals," J. Acoust. Soc. Jpn. 39, 452–462 (1963) (in Japanese).
2) R. J. Van de Plassche, "A sigma-delta modulator as an A/D converter," IEEE Trans. CAS-25, 510–514 (1978).
3) B. P. Agrawal and K. Shenoi, "Design methodology for Sigma Delta Modulation," IEEE Trans. Commun. COM-31, 360–369 (1983).
4) Y. Yamasaki, "AD/DA converter and digital filter," J. Acoust. Soc. Jpn. 46, 251–257 (1990) (in Japanese).
5) Y. Matsuya, K. Uchimura and A. Iwata, "A multi-stage noise shaping 16-bit CMOS A to D conversion LSI," Tech. Rep. ICD87-52, IEIC., 7–12 (1987) (in Japanese).
6) K. Takabayashi, H. Ohno, K. Nakae, N. Seiyama, Y. Yamasaki and T. Itow, "Control of sound field by real time convolver," Proc. Spring Meeting Acoust. Soc. Jpn. 385–386 (1989,3) (in Japanese).
7) T. Okada, K. Kimura, M. Kaneko, G. Shiraishi, M. Maeda and Y. Yamasaki, "Multi-point active noise control in case of noise sources known electrically" Meeting Acoust. Soc. Jpn. (1991,3) (in Japanese).

The invention is claimed as follows:

1. A 1-bit high speed analog-to-digital and digital-to-analog conversion system for improved digital-to-analog conversion at higher speed and over a wider frequency range comparable to relatively lower speed and narrower frequency range conversion systems, said system comprising:
    input circuit means for receiving an analog input signal;
    analog-to-digital conversion means for quantizing said analog input signal using a controlled spectrum of quantizing noise to produce a 1-bit high speed digital signal so that quantization noise of said 1-bit high speed digital signal is concentrated at a high frequency band, the frequency of the high frequency band being higher than the frequency band of said analog input signal; and
    digital-to-analog conversion means for receiving and band-limiting said 1-bit high speed digital signal to produce an analog output signal of a form substantially similar to the form of the analog input signal, wherein said analog-to-digital conversion means comprises:
    an integration circuit, comprising a plurality of cascaded integrators, for integrating the analog input signal,
    a 1-bit quantizer connected to the integration circuit for quantizing the output signal of the integration circuit, and
    a delay circuit for delaying the output signal of the 1-bit quantizer and supplying the delayed signal to the integration circuit.

2. A system according to claim 1, further comprising an emphasis circuit interposed ahead of said analog-to-digital conversion means for amplifying said analog input signal in a predetermined frequency band and a de-emphasis circuit following said digital-to-analog conversion means for attenuating said analog output signal in the predetermined frequency band.

3. A system according to claim 1, wherein said analog-to-digital conversion means further comprises a plurality of feedback loops provided in the integration circuit.

4. A system according to claim 1, wherein said digital-to-analog conversion means comprises a low pass filter circuit.

5. A system according to claim 1, further comprising processing means for conducting a predetermined processing of said 1-bit high speed digital signal.

6. A system according to claim 5, wherein said predetermined processing comprises recording said 1-bit high speed digital signal onto a recording medium and reproducing the recorded signal.

7. A 1-bit high speed analog-to-digital and digital-to-analog conversion method for accomplishing an improved digital-to-analog conversion at higher speed and over a wider frequency range comparable to relatively lower speed and narrower frequency range conversion systems, said method comprising the steps of:
    receiving an analog input signal;
    quantizing said analog input signal using a controlled spectrum of quantizing noise to produce a 1-bit high speed digital signal so that quantization noise of said 1-bit high speed digital signal is concentrated at a high frequency band, the frequency of the high frequency band being higher than the frequency band of said analog input signal; and
    receiving said 1-bit high speed digital signal and band-limiting said 1-bit high speed digital signal to produce an analog output signal of a form substantially similar to the form of the analog input signal, wherein said analog-to-digital conversion step comprises the steps of:

integrating the analog input signal using a plurality of cascaded integrators, quantizing the integrated signal by a 1-bit quantizer connected to the integrators, and delaying the output signal of the 1-bit quantizer and supplying the delayed signal to the integrators.

8. A method according to claim 7, further comprising the steps of:

emphasizing said analog input signal in a predetermined frequency band before quantizing the same; and de-emphasizing said analog output signal in the predetermined frequency band.

9. A method according to claim 7, further comprising conducting a predetermined processing of said 1-bit high speed digital signal.

10. A system according to claim 9, wherein said predetermined processing comprises recording said 1-bit high speed digital signal onto a recording medium and reproducing the recorded signal.

11. A method according to claim 7, wherein said band-limiting step further includes de-emphasizing said analog output signal in the predetermined frequency band.

12. A method according to claim 7, wherein said converting step comprises low pass filtering said analog output signal.

* * * * *

UNITED STATES PATENT AND TRADEMARK OFFICE
CERTIFICATE OF CORRECTION

PATENT NO. : 5,351,048

DATED : September 27, 1994

INVENTOR(S) : Yoshio Yamasaki

It is certified that error appears in the above-indentified patent and that said Letters Patent is hereby corrected as shown below:

Please insert tables 1 and 2 in Column 9, Line 63

Table 1  Quantizing noise of $\Sigma\Delta$ modulation

| Order | Output, $Y$ | Spectrum of quantizing noise $N_q(f)$ | Quantizing noise power of $0 \sim f_s/2$ | Quantizing noise of low frequency range (1st~4th : approximation) | Quantizing noise power of $0 \sim f_s/32$ |
|---|---|---|---|---|---|
| 0 | $X + N_q$ | $\dfrac{\Delta^2}{6f_s}$ | $\dfrac{\Delta^2}{12}$ | $\dfrac{\Delta^2}{6}\left(\dfrac{f}{f_s}\right)$ | $6.25 \times 10^{-2} \cdot \dfrac{\Delta^2}{12}$ |
| 1 | $X + (1-z^{-1})N_q$ | $4\sin^2(\pi f/f_s) \cdot \dfrac{\Delta^2}{6f_s}$ | $2 \cdot \dfrac{\Delta^2}{12}$ | $\dfrac{2}{9}\Delta^2\pi^2\left(\dfrac{f}{f_s}\right)^3$ | $4.02 \times 10^{-4} \cdot \dfrac{\Delta^2}{12}$ |
| 2 | $X + (1-z^{-1})^2 N_q$ | $16\sin^4(\pi f/f_s) \cdot \dfrac{\Delta^2}{6f_s}$ | $6 \cdot \dfrac{\Delta^2}{12}$ | $\dfrac{8}{15}\Delta^2\pi^4\left(\dfrac{f}{f_s}\right)^5$ | $1.86 \times 10^{-5} \cdot \dfrac{\Delta^2}{12}$ |
| 3 | $X + (1-z^{-1})^3 N_q$ | $64\sin^6(\pi f/f_s) \cdot \dfrac{\Delta^2}{6f_s}$ | $20 \cdot \dfrac{\Delta^2}{12}$ | $\dfrac{32}{21}\Delta^2\pi^6\left(\dfrac{f}{f_s}\right)^7$ | $5.12 \times 10^{-7} \cdot \dfrac{\Delta^2}{12}$ |
| 4 | $X + (1-z^{-1})^4 N_q$ | $256\sin^8(\pi f/f_s) \cdot \dfrac{\Delta^2}{6f_s}$ | $70 \cdot \dfrac{\Delta^2}{12}$ | $\dfrac{128}{27}\Delta^2\pi^8\left(\dfrac{f}{f_s}\right)^9$ | $1.53 \times 10^{-8} \cdot \dfrac{\Delta^2}{12}$ |

UNITED STATES PATENT AND TRADEMARK OFFICE
CERTIFICATE OF CORRECTION

PATENT NO. : 5,351,048

DATED : September 27, 1994

INVENTOR(S) : Yoshio Yamasaki

It is certified that error appears in the above-indentified patent and that said Letters Patent is hereby corrected as shown below:

Please insert tables 1 and 2 in Column 9, Line 63

Table 2

$$x(t) = \sum_{-\infty}^{\infty} x(nT) \cdot \frac{\sin \pi (t-nT)/T}{(t-nT)/T} \qquad (1)$$

$$y(t) = \frac{\tau}{T} \cdot \frac{\sin \tau \pi f}{\tau \pi f} \cdot \cos 2\pi f(t - \frac{\tau}{2}) \qquad (2)$$

$$Xq = [X] + 1/2 \qquad (3)$$
$$= (X - X_f) + 1/2$$

$$Nq = Xq - X = 1/2 - X_f \qquad (4)$$

$$Xq = [X+D] + 1/2 \qquad (5)$$
$$= (X+D) - (X+D)_f + 1/2$$

$$Nq = D - (X+D)_f + 1/2 \qquad (6)$$

$$Nq = \frac{1}{2} - (X+D)_f \qquad (7)$$

$$Y = X + (1 - z^{-1}) N_q \qquad (8)$$

$$N_{q_1} = (1 - z^{-1}) N_q = H(z) N_q \qquad (9)$$

UNITED STATES PATENT AND TRADEMARK OFFICE
CERTIFICATE OF CORRECTION

PATENT NO. : 5,351,048                                        Page 3 of 4
DATED : September 27, 1994
INVENTOR(S) : Yoshio Yamasaki It is certified that error appears in the above-indentified patent and that said Letters Patent is hereby corrected as shown below:

Please insert tables 1 and 2 in Column 9, Line 63

$$N_q(f) = H(z) \cdot H(z^{-1}) \cdot N_q = (1-z^{-1}) \cdot (1-z) \frac{\Delta^2}{6f_s} \bigg|_{z=\exp j2\pi f/f_s} \quad (10)$$

$$= 4\sin^2(\pi f/f_s) \frac{\Delta^2}{6f_s}$$

$$N_{qt} = \frac{\Delta^2}{6f_s} \int_0^f 4\sin^2(\pi f/f_s) df = \frac{\Delta^2}{6} \left\{ \frac{2f}{f_s} - \frac{\sin(2\pi f/f_s)}{\pi} \right\} \quad (11)$$

$$N_{qt} \approx \frac{2\Delta^2}{9} \pi^2 (f/f_s)^3 \quad (12)$$

$$SN_q \approx 10 \log_{10} \left\{ \frac{9}{16\pi^2} (2^M-1)^2 (f_s/f)^3 \right\} [dB] \quad (13)$$

$$Y = X + (1-z^{-1})^2 N_q \quad (14)$$

$$N_q(f) = 4\sin^4(\pi f/f_s) \cdot \frac{\Delta^2}{6f_s} \quad (15)$$

$$N_{qt} = \frac{8\Delta^2}{3f_s} \int_0^f \sin^4\left(\frac{\pi f}{f_s}\right) df \quad (16)$$

$$= \frac{\Delta^2}{3f_s} \left( 3f - \frac{2f_s}{\pi} \sin\frac{2\pi f}{f_s} + \frac{f_s}{4\pi} \sin\frac{4\pi f}{f_s} \right)$$

$$N_{qt} \approx \frac{8\Delta^2}{15} \cdot \pi^4 (f/f_s)^5 \quad (17)$$

UNITED STATES PATENT AND TRADEMARK OFFICE
CERTIFICATE OF CORRECTION

PATENT NO. : 5,351,048
DATED : September 27, 1994
INVENTOR(S) : Yoshio Yamasaki

It is certified that error appears in the above-indentified patent and that said Letters Patent is hereby corrected as shown below:

Please insert tables 1 and 2 in Column 9, Line 63

$$SN_q = 10 \log_{10} \left\{ \left( \frac{15}{64\pi^4} \right) (2M-1)^2 (f_s/f)^5 \right\} [dB] \quad (11) \tag{18}$$

$$\begin{aligned} Y_1 &= X + (1-z^{-1}) N_{q1} \\ Y_2 &= -N_{q1} + (1-z^{-1}) N_{q2} \\ Y_3 &= -N_{q2} + (1-z^{-1}) N_{q3} \end{aligned} \tag{19}$$

$$Y = Y_1 + (1-z^{-1}) Y_2 + (1-z^{-1})^2 Y_3 = X + (1-z^{-1})^3 N_{q3} \tag{20}$$

Signed and Sealed this

Seventh Day of February, 1995

Attest:

Attesting Officer

BRUCE LEHMAN

Commissioner of Patents and Trademarks